United States Patent
Osada et al.

(10) Patent No.: US 6,731,348 B2
(45) Date of Patent: May 4, 2004

(54) TELEVISION TUNER HAVING SIMPLE LAYOUT AND CAPABLE OF RECEIVING FM BROADCAST SIGNALS WITHOUT INTERFERENCE

(75) Inventors: Shigeru Osada, Fukushima-ken (JP); Masaki Yamamoto, Fukushima-ken (JP); Toshiro Furuta, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 414 days.

(21) Appl. No.: 09/814,343

(22) Filed: Mar. 21, 2001

(65) Prior Publication Data

US 2001/0024241 A1 Sep. 27, 2001

(30) Foreign Application Priority Data

Mar. 23, 2000 (JP) .......................... 2000-087098
May 9, 2000 (JP) .......................... 2000-142253

(51) Int. Cl.⁷ ................................. H04N 5/46
(52) U.S. Cl. .................. 348/729; 348/731; 348/737; 375/345; 455/179.1
(58) Field of Search ................ 348/553, 729, 348/731, 736, 737, 738; 375/345; 455/180.2, 180.3, 179.1, 180.1, 188.1, 188.2; H04N 5/46

(56) References Cited

U.S. PATENT DOCUMENTS

| | | | | |
|---|---|---|---|---|
| 5,369,446 A | * | 11/1994 | Parker et al. | 348/625 |
| 5,842,120 A | * | 11/1998 | Kobayashi et al. | 455/179.1 |
| 5,926,750 A | * | 7/1999 | Ishii | 455/130 |
| 6,020,936 A | * | 2/2000 | Brekelmans | 348/725 |
| 6,044,251 A | * | 3/2000 | Brekelmans | 455/150.1 |
| 6,122,493 A | * | 9/2000 | Kobayashi et al. | 455/193.1 |
| 6,211,925 B1 | * | 4/2001 | Kikuchi | 348/729 |
| 6,342,928 B1 | * | 1/2002 | Ohira | 348/729 |
| 6,344,881 B1 | * | 2/2002 | Endo | 348/729 |
| 6,353,462 B1 | * | 3/2002 | Osada et al. | 348/726 |
| 6,483,552 B1 | * | 11/2002 | Yamamoto | 348/729 |

FOREIGN PATENT DOCUMENTS

| | | | |
|---|---|---|---|
| JP | 02-98209 | * | 4/1990 |
| JP | 09-083400 | | 3/1997 |
| JP | 10-22856 | * | 1/1998 |
| JP | 11-220362 | * | 8/1999 |

* cited by examiner

Primary Examiner—John Miller
Assistant Examiner—Brian Yenke
(74) Attorney, Agent, or Firm—Brinks Hofer Gilson & Lione

(57) ABSTRACT

A television tuner includes a mixer circuit for receiving a television signal or an FM signal, and a local oscillator circuit for generating an oscillation signal received by the mixer circuit. When the television signal is received, a television intermediate-frequency signal is generated by the mixer circuit. When the FM broadcast signal is received, an FM intermediate-frequency signal having a frequency converted to about 10.7 MHz is generated by the mixer circuit.

14 Claims, 3 Drawing Sheets

TELEVISION TUNER HAVING SIMPLE LAYOUT AND CAPABLE OF RECEIVING FM BROADCAST SIGNALS WITHOUT INTERFERENCE

BACKGROUND OF THE INVENTION

1. Field of the Invention

The present invention relates to a television tuner capable of receiving FM broadcast signals.

2. Description of the Related Art

FIG. 5 illustrates a television tuner capable of receiving FM broadcast signals. A television signal, represented by TV, or an FM broadcast signal, represented by FM, is received by an input tuner circuit 21. The input signal is conditioned by a first mixer circuit 24, a radio frequency (RF) amplifier circuit 22, and an interstage tuner circuit 23.

The first mixer circuit 24 receives a local oscillation signal from a first local oscillator circuit 25. The tuned frequency of the input tuner circuit 21, the interstage tuner circuit 23, and the frequency (local oscillating frequency) of the first local oscillator circuit 25 are controlled by a channel select signal S received by a phase-locked loop (PLL) circuit 26. Generally, the local oscillating frequency is higher than the tuned frequency.

When receiving a television signal, a television intermediate-frequency signal having a video intermediate-frequency, according to US standards, e.g., a video intermediate-frequency of 45.75 MHz, is generated by the first mixer circuit 24. When necessary, an FM broadcast signal (hereinafter referred to as the "first FM IF signal") is converted to a television intermediate-frequency signal by the first mixer circuit 24. The television intermediate-frequency signal generated by the first mixer circuit 24 is passed to a subsequent intermediate-frequency circuit (not shown) through a first intermediate-frequency filter 27 for further processing.

The first FM IF signal generated by the first mixer circuit 24 is also received by a second mixer circuit 29 through a second intermediate-frequency filter 28. The second mixer circuit 29 receives a local oscillation signal from a second local oscillator circuit 30. The frequency of the local oscillation signal generated by the second local oscillator circuit 30 is 10.7 MHz higher in frequency than the frequency of the first FM IF signal. Therefore, an FM broadcast signal (hereinafter referred to as the "second FM IF signal") having a frequency converted to a 10.7 MHz signal is generated by the second mixer circuit 29. The second FM IF signal is received by a demodulator circuit (not shown) through a third intermediate-frequency filter 31.

Accordingly, a television tuner can include two mixer circuits 24 and 29, and two local oscillator circuits 25 and 30 that achieve a two-stage frequency conversion in which an FM broadcast signal is first frequency-converted to a television intermediate-frequency signal before being converted to an intermediate-frequency signal of 10.7 MHz used in a conventional FM receiver. This two-stage structure creates beat disturbances between the two local oscillation signals, which interferes with reception.

SUMMARY OF THE INVENTION

A television tuner preferably includes a single mixer circuit and a single local oscillator circuit which provides a simplified layout that is immune to a wide range of interference such as beat disturbances.

In one aspect, a television tuner includes a mixer coupled to a local oscillator circuit. Preferably, the mixer is configured to receive a television signal and an FM broadcast signal. The local oscillator circuit generates a local oscillation signal received by the mixer circuit. When a television signal is received, a television intermediate-frequency signal is generated by the mixer circuit. When an FM broadcast signal is received, an FM intermediate-frequency signal converted to 10.7 MHz is generated by the mixer circuit. Only a single local oscillator circuit is used to obtain a television intermediate-frequency signal and an FM intermediate-frequency signal converted to about 10.7 MHz.

Preferably, the television signal or the FM broadcast signal is received by a tuner circuit that includes a mixer circuit. The local oscillation frequency and the tuned frequency of the tuner circuit can be adjusted when the local oscillation frequency is higher than the tuned frequency of the tuner circuit by a frequency of a television intermediate-frequency signal. In embodiments where the frequency of the local oscillation signal is about 10.7 MHz higher than the frequency of the FM broadcast signal, the tuned frequency may be adjusted so that the difference between the tuned frequency and the frequency of the local oscillation signal is about 10.7 MHz. Therefore, when the television signal is received, a television intermediate-frequency signal is generated by the mixer circuit, and when the FM broadcast signal is received, an FM intermediate-frequency signal having a frequency converted to about 10.7 MHz is generated by the mixer circuit.

In another aspect, the television tuner includes a first varactor diode and the local oscillator circuit includes a second varactor diode. Preferably, the frequency of the local oscillation signal is higher than the tuned frequency of the tuner circuit by a frequency of the television intermediate-frequency signal when a common voltage is applied to the first varactor diode and to the second varactor diode. In applications where the frequency of the local oscillation signal is about 10.7 MHz higher than the frequency of the FM broadcast signal, a higher voltage is applied to the first varactor diode than to the second varactor diode. The difference between the tuned frequency and the frequency of the local oscillation signal may thus be about 10.7 MHz.

The television tuner may include a phase lock loop (PLL) circuit for generating a tuning voltage that is applied to the first varactor diode and to the second varactor diode. The television tuner further includes a voltage adder circuit, and a voltage supply that supplies a positive voltage. Preferably, the tuning voltage is applied to a cathode of the second varactor diode and to an input of the voltage adder circuit. Preferably, a positive voltage is applied to the voltage adder circuit only when an FM broadcast signal is received. The positive voltage is added to the tuning voltage to generate a voltage that is applied to the cathode of the first varactor diode.

Alternatively, the television tuner may include a PLL circuit for generating a tuning voltage that is applied to the first varactor diode and to the second varactor diode and a voltage supply that supplies a negative voltage. Preferably, the tuning voltage is applied to the cathode of the first varactor diode and to the cathode of the second varactor diode, and the negative voltage is applied to an anode of the first varactor diode only when the FM broadcast signal is received. Accordingly, a higher voltage is applied to the first varactor diode.

Preferably, the television signal or the FM broadcast signal is received by a tuner circuit before the signal is conditioned by the mixer circuit. Preferably, the frequency of the local oscillation signal and the tuned frequency of the tuner circuit can be adjusted while the frequency of the local oscillation signal is higher than the tuned frequency of the tuner circuit by a frequency of the television intermediate-frequency signal. In applications where the tuned frequency corresponds to the frequency of the FM broadcast signal, the frequency of the local oscillation signal is adjusted so that the difference between the tuned frequency and the frequency of the local oscillation signal is about 10.7 MHz. Therefore, when the television signal is received, a television intermediate-frequency signal is generated by the mixer circuit. When the FM broadcast signal is received, an FM intermediate-frequency signal having a frequency converted to about 10.7 MHz is generated by the mixer circuit.

Preferably, the television tuner includes a first varactor diode and the local oscillator circuit includes a second varactor diode. Preferably, the frequency of the local oscillation signal is higher than the tuned frequency by the frequency of the television intermediate-frequency signal while a common voltage is applied to the first varactor diode and to the second varactor diode. In applications where the tuned frequency corresponds to the frequency of the FM broadcast signal, a lower voltage is applied to the second varactor diode than to the first varactor diode. The difference between the tuned frequency and the frequency of the local oscillation signal may thus be about 10.7 MHz.

The television tuner may include a PLL circuit for generating a tuning voltage that is applied to the first varactor diode and to the second varactor diode. The television tuner further includes a voltage subtractor circuit and a voltage for supplying a positive voltage. Preferably, the tuning voltage is applied to the cathode of the first varactor diode and to an input of the voltage subtractor circuit. Preferably, a positive voltage is applied to the voltage subtractor circuit only when the FM broadcast signal is received. The voltage subtractor circuit subtracts the positive voltage from the tuning voltage, to generate a voltage that is applied to the cathode of the second varactor diode.

Alternatively, the television tuner may include a PLL circuit for generating a tuning voltage that is applied to the first varactor diode and to the second varactor diode, and a voltage supply that supplies a positive voltage. Preferably, the tuning voltage is applied to the cathode of the first varactor diode and to the cathode of the second varactor diode, and the positive voltage is applied to the anode of the second varactor diode only when the FM broadcast signal is received. Accordingly, a lower voltage is applied to the second varactor diode.

DESCRIPTION OF THE PREFERRED EMBODIMENTS

Figure 1:
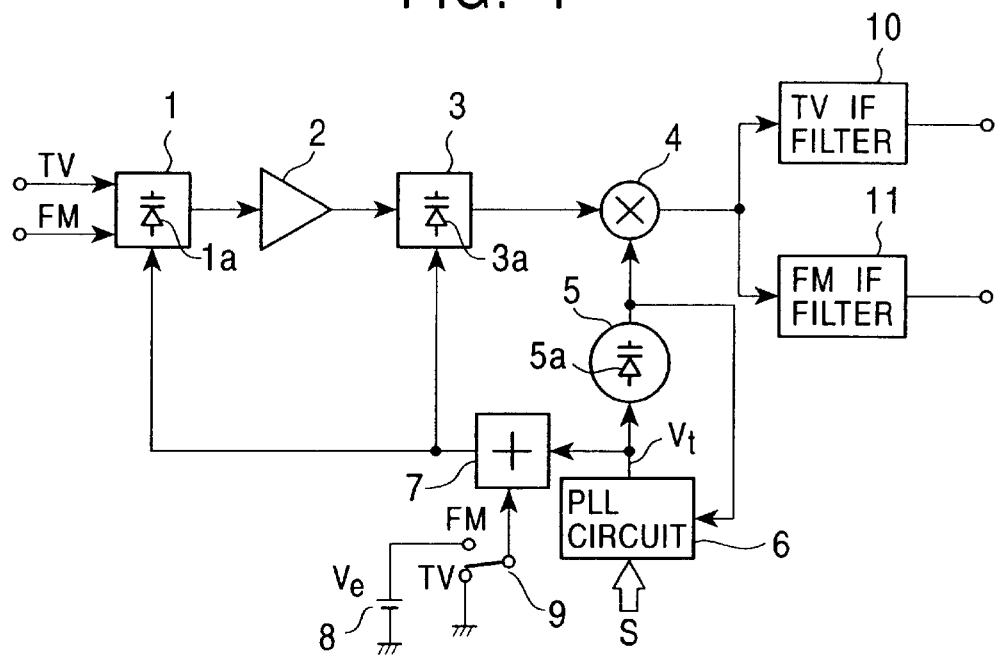
FIG. 1 is a block diagram of a television tuner according to a first embodiment.

FIG. 1 illustrates a television tuner according to a first embodiment. Either a television signal, represented by TV, or an FM broadcast signal, represented by FM, is received by an input tuner circuit 1. The input signal is received by a mixer circuit 4 through a radio frequency (RF) amplifier circuit 2 and an interstage tuner circuit 3. The mixer circuit 4 also receives a local oscillation signal from a local oscillator circuit 5. The input tuner circuit 1 and the interstage tuner circuit 3 include first varactor diodes 1a and 3a, respectively, that provide tunable or programmable passbands. The local oscillator circuit 5 includes a second varactor diode 5a that generate a selectable frequency (the "local oscillating frequency"). In other words, the local oscillating frequency can be programmed or adjusted by adjusting an applied voltage.

The tuned frequency of the input tuner circuit 1 and the interstage tuner circuit 3, and the local oscillating frequency of the local oscillator circuit 5 are controlled by a tuning voltage $V_t$ that is preferably generated by a PLL circuit 6. In this embodiment, when a common voltage is applied to the first varactor diodes 1a and 3a and to the second varactor diode 5a, the local oscillating frequency is higher than a tuned frequency of the input tuner circuit 1 by an intermediate-frequency of a television signal.

To receive a television signal, a common voltage is applied to the first varactor diodes 1a and 3a and to the second varactor diode 5a. To receive an FM broadcast, a higher voltage is applied to the first varactor diodes 1a and 3a than to the second varactor diode 5a so that the difference between the tuned frequency and the local oscillating frequency is about 10.7 MHz.

In this embodiment, the tuning voltage $V_t$ is applied to a cathode of the second varactor diode 5a, and to an input of a voltage adder circuit 7. The anode of the second varactor diode 5a is preferably grounded. Only when the FM signal is received, does a voltage supply 8 supply a positive voltage $V_e$ to the input of the voltage adder circuit 7 through a switching unit 9. That is, in embodiments where the local oscillating frequency is 10.7 MHz higher than the frequency of the FM broadcast signal, the voltage $V_e$ is supplied to the voltage adder circuit 7. The voltage adder circuit 7 adds the voltage $V_e$ to the tuning voltage $V_t$ generated by the PLL circuit. The summed voltage is applied to the cathodes of the first varactor diodes 1a and 3a. The anodes of the first varactor diodes preferably 1a and 3a are grounded. The voltage across the first varactor diodes 1a and 3a is thus increased by the summed voltage, increasing the tuned frequency passband. By selecting a positive voltage $V_e$, the resulting tuned frequency corresponds to the frequency of the FM broadcast band, which enables the television tuner to receive the FM broadcast signals and convert these signals into audio. Accordingly, an FM broadcast signal, such as the FM intermediate-frequency signal, having a frequency converted to about 10.7 MHz is generated by the mixer circuit 4.

Since the voltage supply 8 does not supply a voltage to the voltage adder circuit 7 when a television signal is received, the tuning voltage $V_t$ supplied by the PLL circuit 6 is transferred through the voltage adder circuit 7 without any addition. As a result, the mixer circuit 4 generates an intermediate-frequency signal at a television intermediate-frequency signal (the "TV intermediate-frequency signal") The TV intermediate-frequency signal generated by the mixer circuit 4 is received by a subsequent intermediate-frequency circuit (not shown) through a TV intermediate-frequency filter 10 for processing.

The FM intermediate-frequency signal output generated by the mixer circuit 4 can be passed to a demodulator circuit (not shown) through an FM intermediate-frequency filter 11. This conditioning preferably generates an audio signal.

Figure 2:
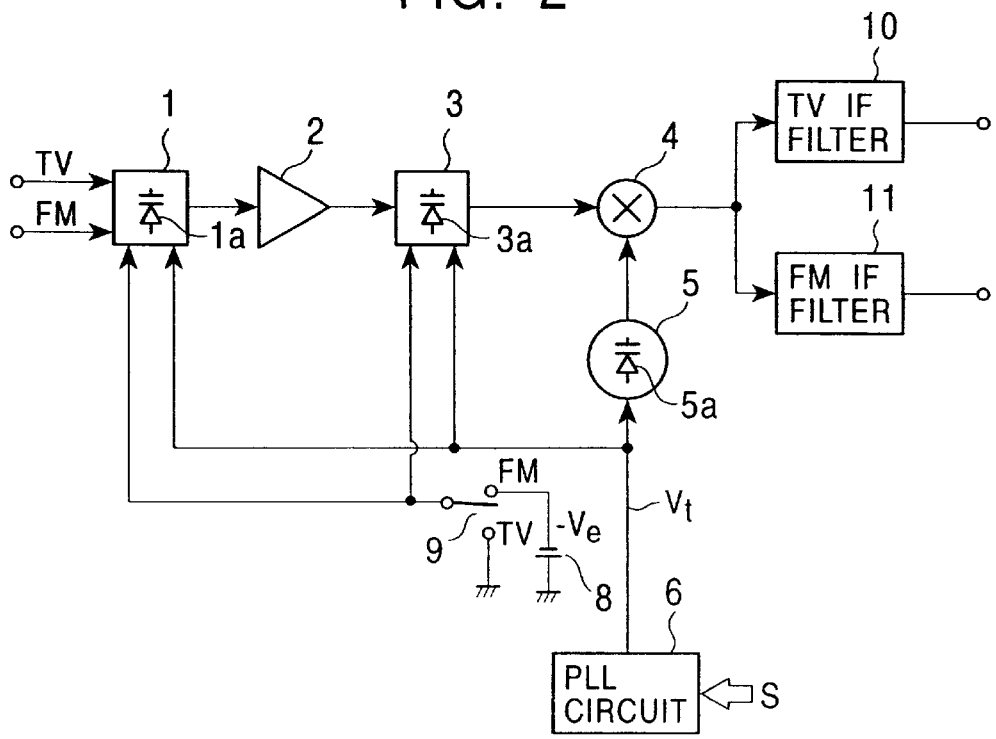
FIG. 2 is a block diagram of a modified television tuner according to the first embodiment.

FIG. 2 illustrates a modification of the first embodiment. The voltage supply 8 supplies a negative voltage $-V_e$. The anodes of the first varactor diodes 1a and 3a are grounded through resistors (not shown), while the anode of the second varactor diode 5a is directly grounded. The tuning voltage $V_t$ generated by the PLL circuit 6 is applied to the cathodes of the first varactor diodes 1a and 3a, and to the cathode of the second varactor diode 5a. In applications where the local oscillating frequency is about 10.7 MHz higher than the frequency of FM broadcast signal, the negative voltage $-V_e$ is applied to the cathodes of the first varactor diodes 1a and 3a through the switching unit 9. A voltage applied to the first varactor diodes 1a and 3a is thus increased, making the tuned frequency of the input tuner circuit 1 higher. By selecting a negative voltage $-V_e$, FM broadcasts are received. Accordingly, the FM intermediate-frequency signal having a frequency converted to about 10.7 MHz is generated by the mixer circuit 4.

Since the cathodes of the first varactor diodes 1a and 3a are grounded through the switching unit 9 when a television signal is received in this embodiment, the input tuner circuit 1 and the interstage tuner circuit 3 are tuned to the frequency band of the television signal. Accordingly, the mixer circuit 4 generates a TV intermediate-frequency signal.

Figure 3:
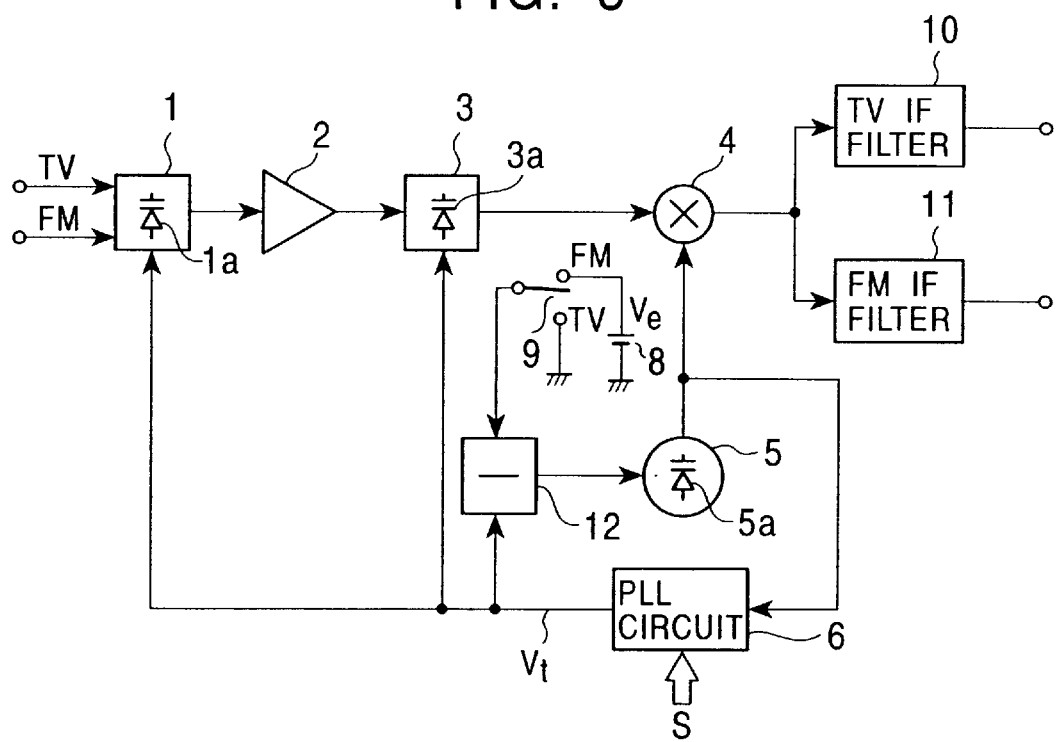
FIG. 3 is a block diagram of a television tuner according to a second embodiment.

FIG. 3 illustrates a television tuner according to a second embodiment. The anodes of the first varactor diodes 1a and 3a and the anode of the second varactor diode 5a are grounded. The tuning voltage $V_t$ is applied to the cathodes of the first varactor diodes 1a and 3a, and is received by a voltage subtractor circuit 12. Only when an FM signal is received, when the tuned frequency of the tuner circuits 1 and 3 corresponds to the frequency of the FM broadcast signal, does the voltage supply 8 supply a positive voltage $V_e$ to an input of the voltage subtractor circuit 12. The voltage subtractor circuit 12 subtracts the positive voltage $V_e$ from the tuning voltage $V_t$ and outputs a difference voltage. The resulting difference voltage is applied to the cathode of the second varactor diode 5a, which causes a voltage drop across the second varactor diode 5a to be reduced which reduces the local oscillating frequency. Through a selection of positive voltage $V_e$, the resulting local oscillating frequency is about 10.7 MHz higher than the frequency of the FM signal, and an FM intermediate-frequency signal having a frequency converted to about 10.7 MHz is generated by the mixer circuit 4. Since the voltage supply 8 does not supply a voltage to the voltage subtractor circuit 12 when a television signal is received, the tuning voltage $V_t$ supplied by the PLL circuit 6 is transferred from the voltage subtractor circuit 12 without a subtraction. As a result, the mixer circuit 4 generates a TV intermediate-frequency signal.

Figure 4:
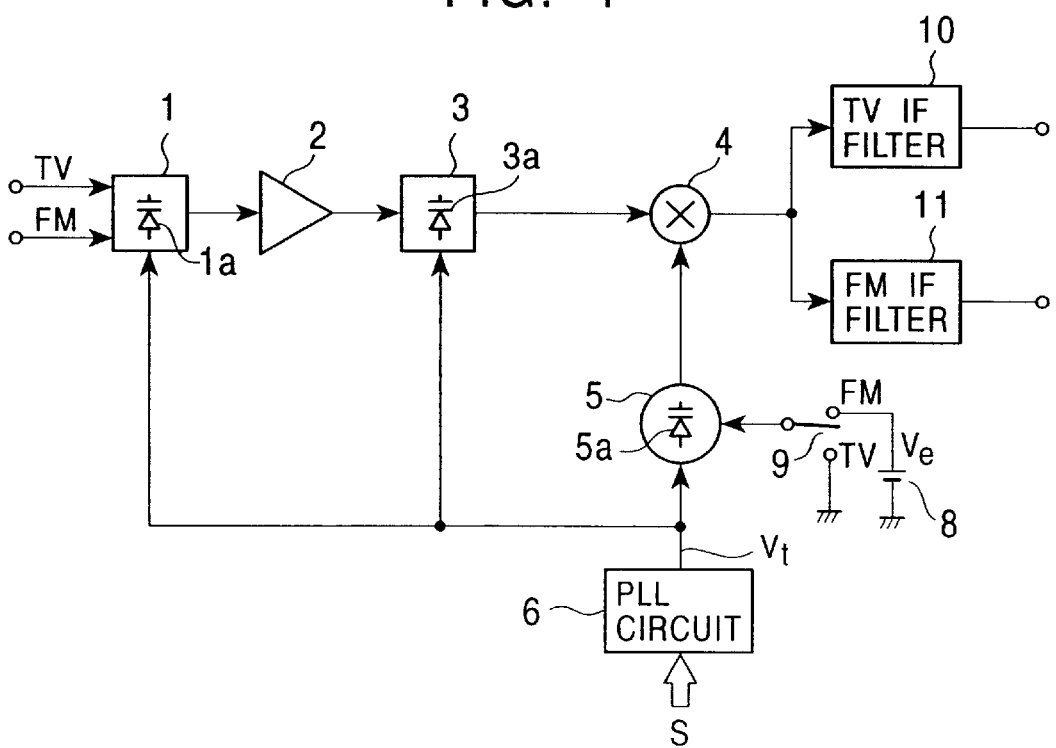
FIG. 4 is a block diagram of a modified television tuner according to the second embodiment.
Figure 5:
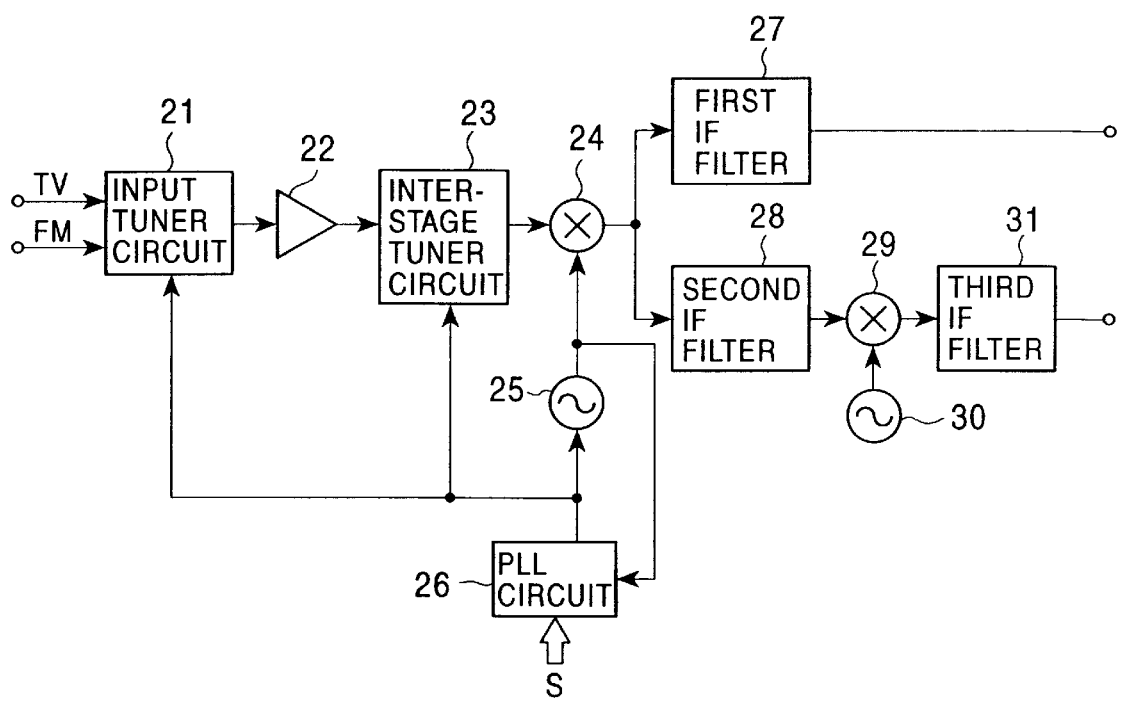
FIG. 5 is a block diagram of a conventional television tuner.

FIG. 4 illustrates a modification of the second embodiment. The voltage supply 8 supplies a positive voltage $V_e$. The anodes of the first varactor diodes 1a and 3a are grounded, while the anode of the second varactor diode 5a is grounded through a resistor (not shown). The tuning voltage $V_t$ generated by the PLL circuit 6 is applied to the cathodes of the first varactor diodes 1a and 3a and to the cathode of the second varactor diode 5a. In embodiments where the tuned frequency of the input tuner circuit 1 and the interstage tuner circuit 3 corresponds to the frequency of the FM broadcast signal, the positive voltage $V_e$ is applied to the anode of the second varactor diode 5a through the switching unit 9. The voltage drop across the second varactor diode 5a is thus reduced, which reduces the local oscillating frequency. By setting the positive voltage $V_e$ so that the resulting oscillating frequency is about 10.7 MHz lower than the frequency of the FM broadcast signal, the FM intermediate-frequency signal having a frequency converted to about 10.7 MHz is generated by the mixer circuit 4. Since the cathode of the second varactor diode 5a is grounded through the switching unit 9 when a television signal is received, the mixer circuit 4 generates a TV intermediate-frequency signal.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A television tuner comprising:
   a mixer circuit configured to receive a television signal and an FM signal;
   a tuner coupled to the mixer circuit; the tuner comprising a first varactor diode; and
   a local oscillator circuit configured to generate an oscillation signal received by the mixer circuit, the local oscillator circuit comprising a second varactor diode that is configured to create a selectable oscillating frequency, the oscillating frequency being higher than a tuned frequency of the tuner by a frequency of a television intermediate-frequency signal when a common voltage is applied to the first varactor diode and to the second varactor diode, and when receiving the FM signal, a higher voltage is applied to the first varactor diode than to the second varactor diode;
   wherein a television intermediate-frequency signal is generated by the mixer circuit when the television signal is received, and an FM intermediate-frequency signal having a frequency converted to about 10.7 MHz is generated by the mixer circuit when the FM signal is received.

2. A television tuner according to claim 1, wherein the tuner circuit comprises an input configured to receive the television signal and the FM signal, and an output coupled to an input of the mixer circuit, wherein a frequency of the oscillation signal and a tuned frequency of the tuner circuit are adjustable when the frequency of the oscillation signal is higher than the tuned frequency of the tuner.

3. A television tuner according to claim 1, further comprising:
   a PLL circuit coupled to the first varactor diode and to the second varactor diode;
   a voltage adder circuit coupled to the first varactor diode; and
   a voltage supply selectably coupled to said voltage adder,
   wherein the tuning voltage is applied to a cathode of the second varactor diode and to an input of the voltage adder circuit, and only when the FM signal is received is a positive voltage applied to the input of the voltage adder circuit which adds the positive voltage to the tuning voltage to generate a voltage that is applied to a cathode of the first varactor diode.

4. A television tuner according to claim 1, further comprising:
   a PLL circuit coupled the first varactor diode and to the second varactor diode; and
   a voltage supply selectably coupled to the first varactor diode, wherein the tuning voltage is applied to a cathode of the first varactor diode and to a cathode of the second varactor diode, and a negative voltage is applied to an anode of the first varactor diode only when the FM signal is received.

5. A television tuner according to claim 1, wherein the tuner comprises an input configured to receive the television signal and the FM signal, and an output configured to transfer one of the television signal and the FM broadcast signal to an input of the mixer circuit, wherein the frequency of the oscillation signal and a tuned frequency of the tuner circuit are adjusted when the frequency of the oscillation signal is higher than the tuned frequency of the tuner by a frequency of the television intermediate-frequency signal, and where a tuned frequency corresponds to the frequency of the FM signal and the frequency of the oscillation signal is adjusted so that a difference between the tuned frequency and the frequency of the local oscillation signal is about 10.7 MHz.

6. A television tuner according to claim 5, wherein the first varactor diode is configured to create a tunable passband.

7. A television tuner according to claim 6, further comprising:

a PLL circuit coupled to the first varactor diode and to the second varactor diode;

a voltage subtractor circuit coupled to the second varactor diode; and a voltage supply selectably coupled to the voltage subtractor, wherein the tuning voltage is applied to a cathode of the first varactor diode and to an input of the voltage subtractor circuit, and only when the FM signal is received is a positive voltage from the voltage supply applied to the input of the voltage subtractor circuit which is configured to subtract the positive voltage from the tuning voltage, wherein a difference voltage is applied to a cathode of the second varactor diode.

8. A television tuner according to claim 6, further comprising:

a PLL circuit coupled to the first varactor diode and to the second varactor diode; and a voltage supply selectably coupled to the second varactor diode, wherein the tuning voltage is applied to a cathode of the first varactor diode and to a cathode of the second varactor diode, and the positive voltage is applied to an anode of the second varactor diode only when the FM signal is received.

9. A television tuner comprising:

a mixer configured to receive a television signal and an FM signal;

a tuner coupled to the mixer; the tuner comprising a first semiconductor device having a capacitance that is sensitive to an applied voltage; and a local oscillator configured to generate an oscillation signal received by the mixer, the local oscillator comprising a second semiconductor device having a capacitance that is sensitive to a second applied voltage;

the local oscillator configured to create a selectable oscillating frequency, the oscillating frequency being higher than a tuned frequency of a television intermediate-frequency when the first applied voltage and the second applied voltage comprise a common voltage;

when receiving the FM signal, a higher voltage is applied to the first semiconductor device than to the second semiconductor device.

10. A television tuner according to claim 9, further comprising:

a PLL circuit coupled to the first semiconductor device and to the second semiconductor device; and a voltage supply selectably coupled to the second semiconductor device, wherein a tuning voltage is applied to the first semiconductor device and to the second semiconductor device when receiving the television signal or the FM signal, and a positive voltage is applied to the second semiconductor device when receiving the FM signal.

11. A television tuner according to claim 10, further comprising a first circuit that sums two input signals, the first circuit being coupled to the first semiconductor device.

12. A television tuner according to claim 10, further comprising a second circuit that subtracts two input signals, the second circuit being coupled to the second semiconductor device.

13. A television tuner according to claim 10, further comprising an FM filter coupled to the mixer.

14. A television tuner according to claim 10, further comprising a TV filter coupled to the mixer.

* * * * *

UNITED STATES PATENT AND TRADEMARK OFFICE
CERTIFICATE OF CORRECTION

PATENT NO. : 6,731,348 B2 Page 1 of 1
DATED : May 4, 2004
INVENTOR(S) : Shigeru Osada et al.

It is certified that error appears in the above-identified patent and that said Letters Patent is hereby corrected as shown below:

Title page,
Item [56], References Cited, U.S. PATENT DOCUMENTS, insert
-- 5,710,993      01/1998      Brekelmans --.
FOREIGN PATENT DOCUMENTS, insert
-- JP            57155885    09/1982 --.

Signed and Sealed this

Eleventh Day of April, 2006

JON W. DUDAS
*Director of the United States Patent and Trademark Office*